United States Patent
Fukuoka et al.

(10) Patent No.: US 7,906,752 B2
(45) Date of Patent: Mar. 15, 2011

(54) SOLID-STATE IMAGING APPARATUS

(75) Inventors: Naoto Fukuoka, Atsugi (JP); Seisuke Matsuda, Hachioji (JP)

(73) Assignee: Olympus Corporation, Tokyo (JP)

( * ) Notice: Subject to any disclaimer, the term of this patent is extended or adjusted under 35 U.S.C. 154(b) by 238 days.

(21) Appl. No.: 12/357,717

(22) Filed: Jan. 22, 2009

(65) Prior Publication Data
US 2009/0184238 A1   Jul. 23, 2009

(30) Foreign Application Priority Data
Jan. 23, 2008 (JP) ................. 2008-012166

(51) Int. Cl.
*H01L 27/00* (2006.01)
*H04N 5/335* (2006.01)

(52) U.S. Cl. .............. 250/208.1; 250/214 R; 348/241; 348/308

(58) Field of Classification Search ............. 250/208.1, 250/214 R, 214 A, 214 C; 348/241, 243, 348/294, 302, 308
See application file for complete search history.

(56) References Cited

U.S. PATENT DOCUMENTS
2009/0284634 A1 * 11/2009 Tsukimura .............. 348/308

FOREIGN PATENT DOCUMENTS
JP   2000-287131 A   10/2000

* cited by examiner

*Primary Examiner* — Kevin Pyo
(74) *Attorney, Agent, or Firm* — Westerman, Hattori, Daniels & Adrian, LLP

(57) ABSTRACT

A solid-state imaging apparatus including: a pixel section having a plurality of pixels arranged into a matrix, each pixel containing a reset section for resetting an accumulation section by supplying a potential retained at a reset line; a correlation double sampling circuit for suppressing a noise signal contained in the pixel signal; and a control section where, of a first one of the pixels and a second one of the pixels connected to the same one of a signal output line, when the first pixel is determined as a pixel subject to reset operation for obtaining an output of the pixel signal corresponding to a first potential supplied by the reset section, a voltage level of the same one signal output line at the time of the reset operation is set with using a pixel signal corresponding to a second potential supplied by the reset section of the second pixel.

7 Claims, 13 Drawing Sheets

SOLID-STATE IMAGING APPARATUS

This application claims benefit of Japanese Patent Application No. 2008-012166 filed in Japan Jan. 23, 2008, the contents of which are incorporated by this reference.

BACKGROUND OF THE INVENTION

The present invention relates to solid-state imaging apparatus, and more particularly relates to the solid-state imaging apparatus using an amplified solid-state imaging device having an amplification function within its imaging region.

In recent years, CMOS (Complementary Metal Oxide Semiconductor) type imaging devices (image sensor) are drawing attention and are practically used as solid-state imaging device. The CMOS imaging devices are capable of being driven by a single power supply when compared to CCD (Charge Coupled Device) type imaging devices. Further, while CCD image sensors require an exclusive process, CMOS image sensors can be manufactured through an identical process as other LSI's. The CMOS image sensors can thus be readily made into an SOC (system on chip) so as to be provided with many functions. Furthermore, since the CMOS image sensors have an amplification circuit (amplifier) in each individual pixel to amplify signal electric charge within the pixel, they are less likely to be affected by noise due to the transmission path of signals. Moreover, the signal electric charge of each pixel in the CMOS image sensors may be extracted by means of a selection system so that, in theory, the accumulation time and/or read sequence of signals can be arbitrarily controlled for each pixel.

It is known of the CMOS image sensors that, when a high-luminance light enters, a completely blackened image is formed as if there is not any incidence of light. This phenomenon will be referred to hereinafter as "black sun phenomenon". The black sun phenomenon will now be described with the operation of a typical CMOS image sensor. FIG. 1 shows a circuit diagram of the CMOS image sensor. A pixel 101 includes: a photodiode PD; a floating diffusion section FD having an electrostatic capacitance of Cfd; a transfer transistor Mtr; a reset transistor Mrs; an amplification transistor Msf; and a select transistor Mse. The pixel 101 is connected through a vertical signal line 102 to a constant current supply 103 and to a CDS (Correlated Double Sampling) circuit 121. The CDS circuit 121 includes: a sample-and-hold transistor Msh; a clamp transistor Mcl; a sample-and-hold capacitor (electrostatic capacitance) Csh; and a clamp capacitor (electrostatic capacitance) Ccl. Further, the CDS circuit 121 is connected to a horizontal signal line 104 through a vertical signal line 102 and a column select transistor Mh. The horizontal signal line 104 is connected to a capacitor (electrostatic capacitance) Ch and to an amplifier 105, and connected through a horizontal signal line reset transistor Mhrs to a horizontal signal line reference voltage Vhrs.

Referring to FIG. 1, those symbols starting with "φ" represent pulse voltages, and those starting with "V" represent voltages at respective locations. Of the pulse voltages, those pulse voltages (transfer pulse φTR, reset pulse φRS, and select pulse φSE) associated with control of the transfer transistor Mtr, reset transistor Mrs, and select transistor Mse within the pixel 101, and the pulse voltage (φH) associated with control of the column select transistor Mh are outputted respectively from a vertical scanning circuit 123 and a horizontal scanning circuit 124 under control of a control signal generation circuit 122. Further, those pulse voltages (sample-and-hold pulse φSH, clamp pulse φCL, and horizontal signal line reset pulse φHRS) associated with control of the sample-and-hold transistor Msh, clamp transistor Mcl, and horizontal signal line reset transistor Mhrs are outputted from the control signal generation circuit 122.

A plurality of the pixels 101 are placed into an array, and electric charges obtained at the photodiode PD are amplified by the amplification transistor Msf in the pixel 101 and are transmitted to the CDS circuit 121. At the CDS circuit 121, the variance of the gate-source voltage (VGS) due to the amplification transistor Msf, and the variance of ktc noise (Vktc) and the feed-through voltage (Vft) due to the reset transistor Mrs that fluctuate from one pixel to another are eliminated by differentiating between the reset signal and the signal of light from each pixel 101. The noise due to the reset transistor Mrs will be referred to hereinafter as Vnoise (=Vktc+Vft).

Shown in FIG. 2 is a timing chart representing the operation of the CMOS image sensor shown in FIG. 1 without an incidence of high-luminance light. At first in the condition where the select pulse φSE, sample-and-hold pulse φSH, and clamp pulse φCL are at High level, the reset pulse φRS is driven to High level. The voltage Vfd at the floating diffusion section FD is thereby set to a power supply voltage Vdd, and an output voltage Vcdsout of the CDS circuit 121 to a clamp reference voltage Vcl. Further, a horizontal signal line voltage Vout is set to a horizontal signal line reference voltage Vhrs by driving the horizontal signal line reset pulse φHRS to High level.

Next when the reset pulse φRS is brought to Low level, the pixel output voltage Vpixout attains a reset voltage Vrst (=Vdd−Vnoise−VGS) as lowered from the power supply voltage Vdd due to the noise Vnoise by the reset transistor Mrs and due to the effect of gate-source voltage VGS at the amplification transistor Msf.

Next at time t1, when the clamp pulse φCL is brought to Low level and the transfer pulse φTR is driven to High level, signal electric charges of light cumulated at the photodiode PD for a predetermined time are transferred to the floating diffusion section FD. The voltage Vfd at the floating diffusion section FD is thereby lowered, and the pixel output voltage Vpixout is also lowered to a pixel light signal voltage Vpixout(sig) in accordance with the signal electric charges. At this time, therefore, the difference ΔVpixout(sig) between the reset voltage Vrst and the pixel section light signal voltage Vpixout(sig) attains ΔVpixout(sig)=Vrst−Vpixout(sig). The CDS circuit output voltage Vcdsout is also lowered to a CDS light signal voltage Vcdsout(sig) in accordance with the signal electric charges. Supposing that Qcl as the amount of electric charges cumulated at the clamp capacitor Ccl at time t1 and Qsh as the amount of electric charges cumulated at the sample-and-hold capacitor Csh, and supposing that Qcl' as the amount of electric charges cumulated at the clamp capacitor Ccl when the sample-and-hold pulse φSH is brought to Low level at time t2 and Qsh' as the amount of electric charges cumulated at the sample-and-hold capacitor Csh, the following equations (1), (2) are obtained.

At time t1:

$$Qcl=Ccl(Vrst-Vcl)$$

$$Qsh=Csh(Vcl-0) \quad (1)$$

At time t2:

$$Qcl'=Ccl[Vpixout(sig)-Vcdsout(sig)]$$

$$Qsh'=Csh[Vcdsout(sig)-0] \quad (2)$$

From the conservation law of the amount of electric charges at time t1, t2, the following equation (3) is obtained.

$$-Qcl+Qsh=-Qcl'+Qsh'$$

$$Vcl-Vcdsout(sig)=Ccl/(Ccl+Csh)\cdot[Vrst-Vpixout(sig)]$$

$$\Delta Vcdsout(sig)=Gcds\cdot\Delta Vpixout(sig)$$

where: $Gcds=Ccl/(Ccl+Csh)$     (3)

Here, even with the same amount of light, the pixel output voltage Vpixout is outputted also with having a variance due to the variance of (Vnoise+VGS), i.e. the sum of the noise at the reset transistor Mrs and the gate-source voltage of the amplification transistor Msf of each pixel. By taking difference at the CDS circuit 121 between the pixel light signal voltage Vpixout(sig) and the reset voltage Vrst of each pixel also containing variance components, however, it is possible as shown in the following equation (4) to remove the variance due to the sum (Vnoise+VGS), i.e. the noise at the reset transistor Mrs and the gate-source voltage of the amplification transistor Msf.

$$Vrst - Vpixout(sig) = \{Vdd - (Vnoise + VGS)\} - \quad (4)$$
$$\{Vdd - (Vnoise + VGS + \Delta Vpixout(sig))\}$$
$$= \Delta Vpixout(sig)$$

Finally at time t2, by bringing the horizontal signal line reset pulse φHRS to Low level and driving the column select pulse φH to High level, the signal voltage is transmitted to the horizontal signal line 104. Supposing that Qsh as the amount of electric charges cumulated at the sample-and-hold capacitor Csh at time t2 and Qh as the amount of electric charges cumulated at the capacitor Ch connected to the horizontal signal line 104 at the same time, and supposing that Qsh' as the amount of electric charges cumulated at the sample-and-hold capacitor Csh at time t3 when the horizontal signal line reset pulse φHRS is driven to High level and the column select pulse φH is brought to Low level and Qh' as the amount of electric charges cumulated at the capacitor Ch connected to the horizontal signal line at the same time, the following equations (5), (6) are obtained.

At time t3:

$$Qsh'=Csh[Vout(sig)-0]$$

$$Qh'=Ch[Vout(sig)-0] \quad (5)$$

At time t2:

$$Qsh=Csh[Vcdsout(sig)-0]$$

$$Qh=Ch[Vhrs-0] \quad (6)$$

From the conservation law of electric charge at time t2, t3, the following equation (7) is obtained.

$$Qsh + Qh = Qsh' + Qh' \quad (7)$$
$$Vout(sig) = Csh/(Csh+Ch)\cdot Vcdsout(sig) +$$
$$Csh/(Csh+Ch)\cdot Vhrs$$
$$= Gh\cdot Vcdsout(sig) + Gh'\cdot Vhrs$$
$$= Gh\{-Gcds\cdot \Delta Vpixout(sig) + Vcl\} +$$
$$Gh'\cdot Vhrs$$

therefore, $$Gh\cdot Vcl + Gh'\cdot Vhrs - Vout = Gh\cdot Gcds\cdot \Delta Vpixout(sig)$$

where:

$$Gh = Csh/(Csh+Ch)$$

$$Gh' = Ch/(Csh+Ch)$$

Supposing Vcl=Vhrs in this case, $$Vhrs-Vout(sig)=Gh\cdot \Delta Vcdsout(sig)$$

$$\Delta Vout(sig)=Gh\cdot \Delta Vcdsout(sig)$$

are attained so that a horizontal signal line light signal voltage ΔVout(sig) corresponding to the signal electric charges generated by the photodiode PD is outputted onto the horizontal signal line 104.

On the basis of the above described circuit operation, the black sun phenomenon will now be described by way of a timing chart of FIG. 3. When a high-luminance light enters into the pixel region, it is possible in some cases that, as shown in FIG. 3, the voltage Vfd at the floating diffusion section FD falls to an allowable minimum value (floating diffusion section minimum voltage Vfdmin) in the period from the bringing of reset pulse φRS to Low level to the driving of the transfer pulse φTR to High level. At this time, the pixel output voltage Vpixout is also lowered to its allowable minimum value (pixel output minimum voltage Vpixoutmin). The reason for this is thought to be for example that an intense light leaks into the floating diffusion section FD so as to generate electric charges not only at the photodiode PD but also at the floating diffusion section FD, or that the electric charges generated at the photodiode PD overflow and are leaked into the floating diffusion section FD.

In this condition, even when the transfer pulse φTR is driven to High level to transmit the signal electric charges of light to the floating diffusion section FD, the voltage Vfd at the floating diffusion section FD is unable to fall beyond the floating diffusion section minimum voltage Vfdmin. For this reason, the pixel output voltage Vpixout also does not fall beyond the pixel output minimum voltage Vpixoutmin so that the difference ΔVpixout(sig) between the reset voltage and the signal voltage is obtained as in the following equation (8) and at the end a horizontal signal line light signal voltage ΔVout(sig)=0 is attained.

$$\Delta Vpixout(sig)=Vpixoutmin-Vpixoutmin=0 \quad (8)$$

For this reason, a completely darkened image as if without any incidence of light at all results in a pixel region on which the high-luminance light is incident.

Some black sun phenomenon prevention circuits have been proposed to suppress this black sun phenomenon. A description will be given below by way of FIGS. 4 and 5 with respect to a black sun phenomenon prevention circuit disclosed for example in Japanese Patent Application Laid-Open 2000-287131. FIG. 4 shows a circuit diagram to prevent the black sun phenomenon. As shown in FIG. 4, a black sun phenomenon prevention circuit 131 is connected to a vertical signal line 102 to which a pixel 101 is connected. Further, a CDS circuit 121 is connected to the vertical signal line 102. A predetermined reset voltage and a signal voltage of light are then differentiated at the CDS circuit 121, and a difference signal thereof is transmitted to a horizontal signal line 104 through a column select transistor Mh. The black sun phenomenon prevention circuit 131 includes a clip voltage generation transistor MD1 and a prevention circuit actuation transistor MD2. A gate of the clip voltage generation transistor MD1 is connected to a clip reference voltage Vref and a drain to a power supply voltage Vdd, and, on the other hand, a black sun phenomenon prevention circuit actuation pulse φRowD is applied on a gate of the prevention circuit actuation transistor MD2. The black sun phenomenon prevention circuit actuation pulse φRowD in this case is outputted from a control signal generation circuit. Further, a source of the prevention circuit actuation transistor MD2 is connected to the vertical signal line 102.

FIG. 5 shows a timing chart for explaining operation of the black sun phenomenon prevention circuit 131. An operation of the black sun phenomenon prevention circuit 131 will now be described by way of FIG. 5. At first, a reset pulse φRS is driven to High level to set voltage Vfd of a floating diffusion section FD to a power supply voltage Vdd. The black sun phenomenon prevention circuit actuation pulse φRowD is also driven to High level to make effective the black sun phenomenon prevention circuit 131 in advance. The clip reference voltage Vref within the black sun phenomenon prevention circuit 131 is previously set to a voltage lower by Va than the power supply voltage Vdd.

Next, when reset pulse φRS is brought to Low level, the voltage Vfd of the floating diffusion section FD falls to the floating diffusion section minimum voltage Vfdmin due to the effect of a high-luminance light. At this time, since the black sun phenomenon prevention circuit actuation pulse φRowD is at High level, the pixel section output voltage Vpixout does not fall beyond the clip voltage Vc(=Vref−VGSD=Vdd−Va−VGSD) due to the black sun phenomenon prevention circuit 131. Here, VGSD is a gate-source voltage of the clip voltage generation transistor MD1. The black sun phenomenon therefore does not occur even when a high-luminance light is incident, and the difference between the pixel light signal voltage Vpixout(sig) and the clip voltage Vc attains $$\Delta Vpixout(sig)'=Vc-Vpixout(sig)(\neq 0).$$

As described above, it is possible to avoid the black sun phenomenon by providing the black sun phenomenon prevention circuit 131.

SUMMARY OF THE INVENTION

In a first aspect of the invention, there is provided a solid-state imaging apparatus including: a pixel section having a plurality of pixels two-dimensionally arranged into a matrix, each pixel containing a photoelectric conversion section for converting an incident light into signal electric charges, an accumulation section for accumulating the signal electric charges, a transfer section for transferring the signal electric charges to the accumulation section, an amplification section for amplifying the signal electric charges accumulated at the accumulation section and outputting it onto a signal output line as a pixel signal, and a reset section for resetting the accumulation section by supplying a potential retained at a reset line to the accumulation section; a correlation double sampling circuit connected to one end of the signal output line for suppressing a noise signal associated with reset operation by the reset section, contained in the pixel signal outputted onto the signal output line; and a control section where, of a first one of the pixels and a second one of the pixels connected to the same one of signal output line, when the first pixel is determined as a pixel subject to reset operation for obtaining an output of the pixel signal corresponding to a first potential supplied by the reset section, a voltage level of the same one signal output line at the time of the reset operation is set with using a pixel signal corresponding to a second potential supplied by the reset section of the second pixel; the second pixel being a pixel located in the vicinity of the first pixel.

In a second aspect of the invention, the control section in the solid-state imaging apparatus according to the first aspect sets the second potential to a level lower than the first potential.

In a third aspect of the invention, the control section in the solid-state imaging apparatus according to the first aspect sequentially changes the second pixel in accordance with location of the first pixel.

In a fourth aspect of the invention, the potential of the reset line in the solid-state imaging apparatus according to the first aspect is changeable by the unit of row, and the control section variably sets the potential of each reset line connected to the respective pixels in accordance with a setting of the first pixel and the second pixel.

In a fifth aspect of the invention; the control section in the solid-state imaging apparatus according to the first aspect causes an end timing of application of the second potential to the second pixel to be delayed from an end timing of application of the first potential to the first pixel.

In a sixth aspect of the invention, the reset line in the solid-state imaging apparatus according to the first aspect is capable of variably supplying a single potential to all pixels, and the control section controls potentials of the reset line so as not to cause an overlap of timings of applying different potentials respectively to the first pixel and to the second pixel.

In a seventh aspect of the invention, the control section in the solid-state imaging apparatus according to the first aspect, before driving the transfer section of the first pixel, uses a pixel signal corresponding to a third potential supplied by the reset section of the second pixel to set to the same signal output line a voltage level for outputting a pixel signal corresponding to signal electric charges of the first pixel.

DESCRIPTION OF THE PREFERRED EMBODIMENTS

Some embodiments of the solid-state imaging apparatus according to the invention will be described below with reference to the drawings.

The present invention features that, presuming as described above that gate-source voltages VGS of a plurality of pixel's amplification transistors that are proximate to each other in location are to respectively take near values in the course of the manufacturing process, a proximate pixel of the pixel to be read out having a near value with each other as the value of gate-source voltage VGS of the amplification transistor of pixel is used to generate a clip voltage to prevent the black sun phenomenon.

Embodiment 1

Figure 1:
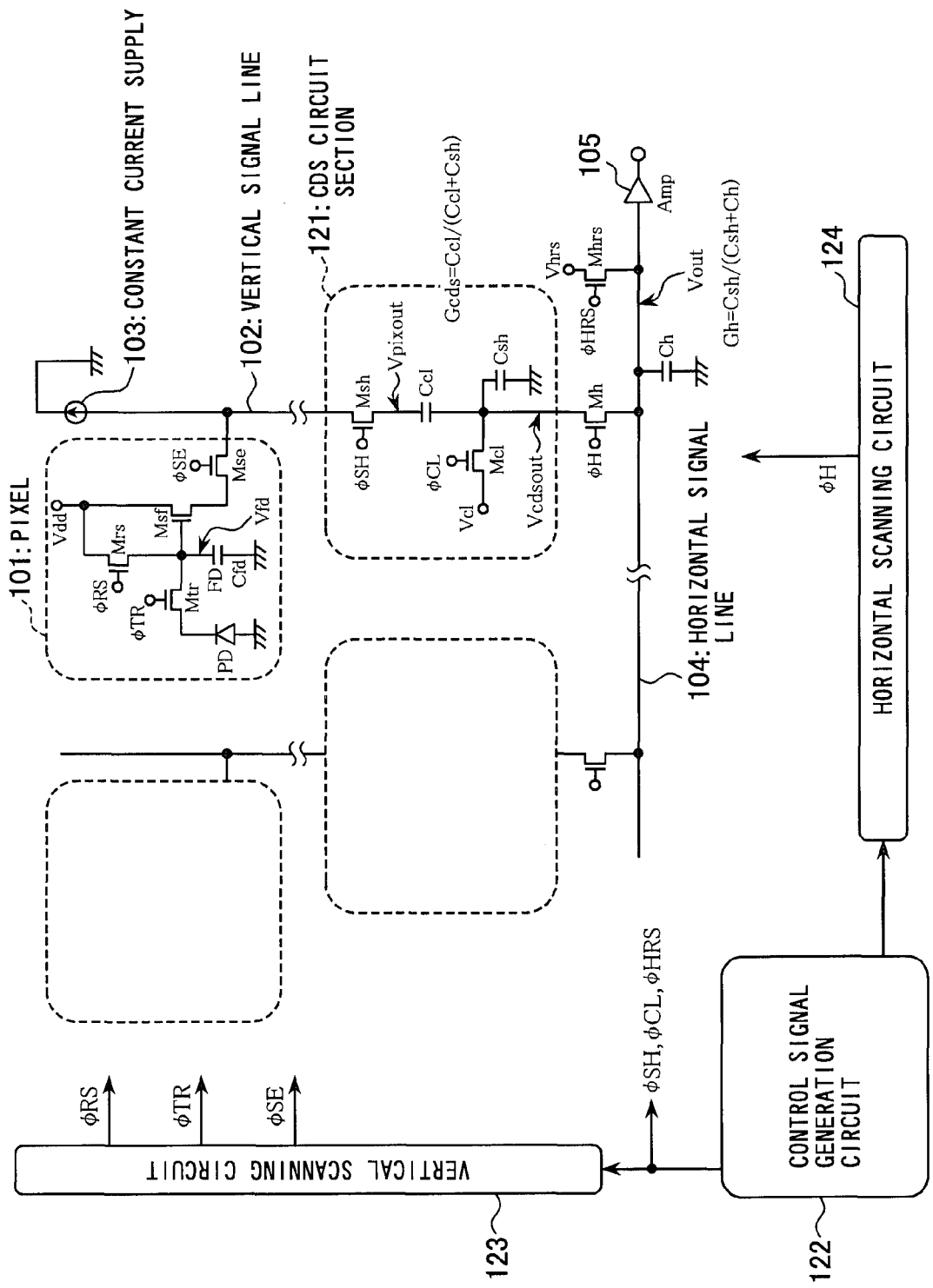
FIG. 1 is a circuit diagram showing a prior-art CMOS image sensor.
Figure 2:
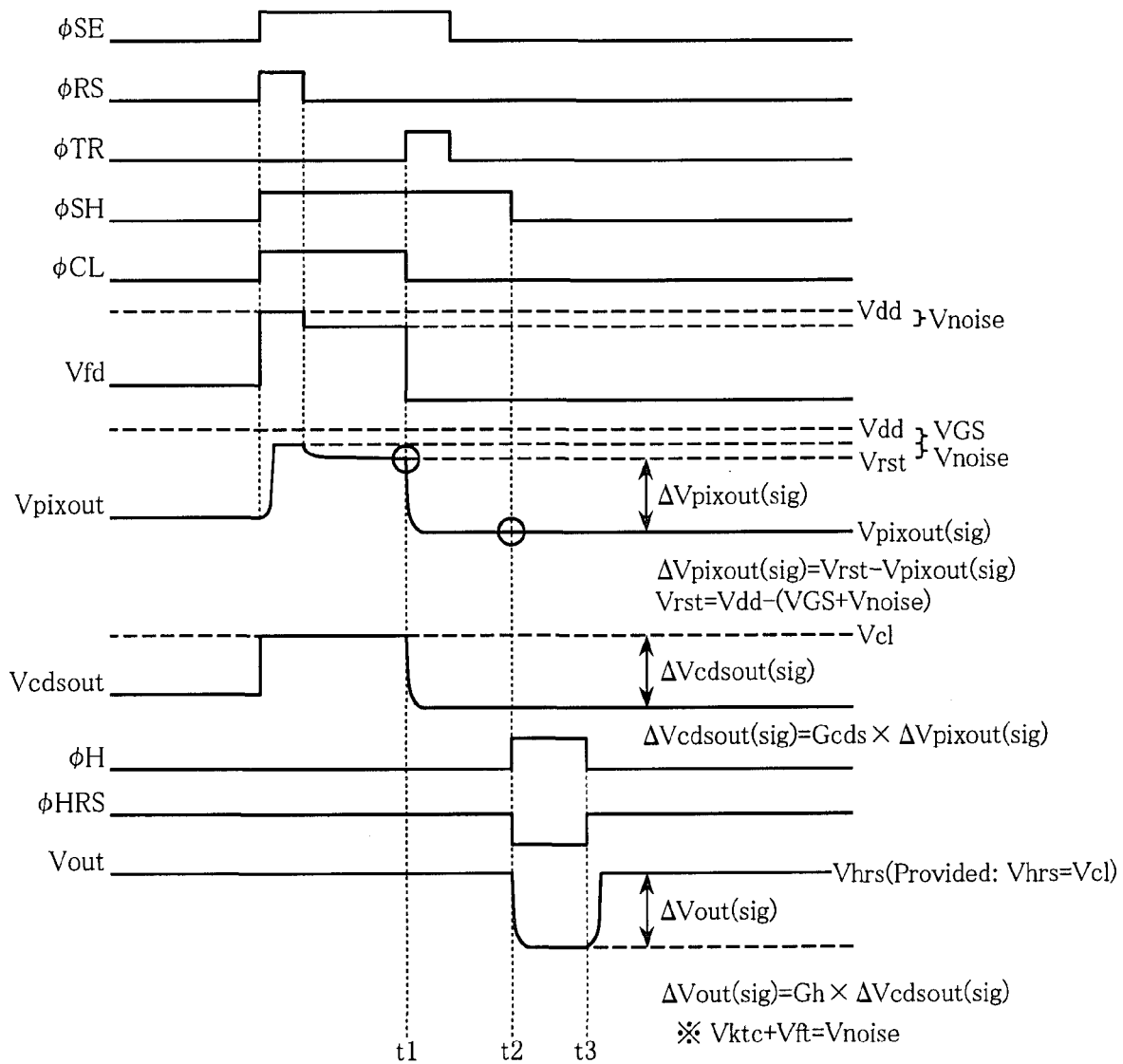
FIG. 2 is a timing chart for explaining operation in the case without an incidence of high-luminance light in the CMOS image sensor shown in FIG. 1.
Figure 3:
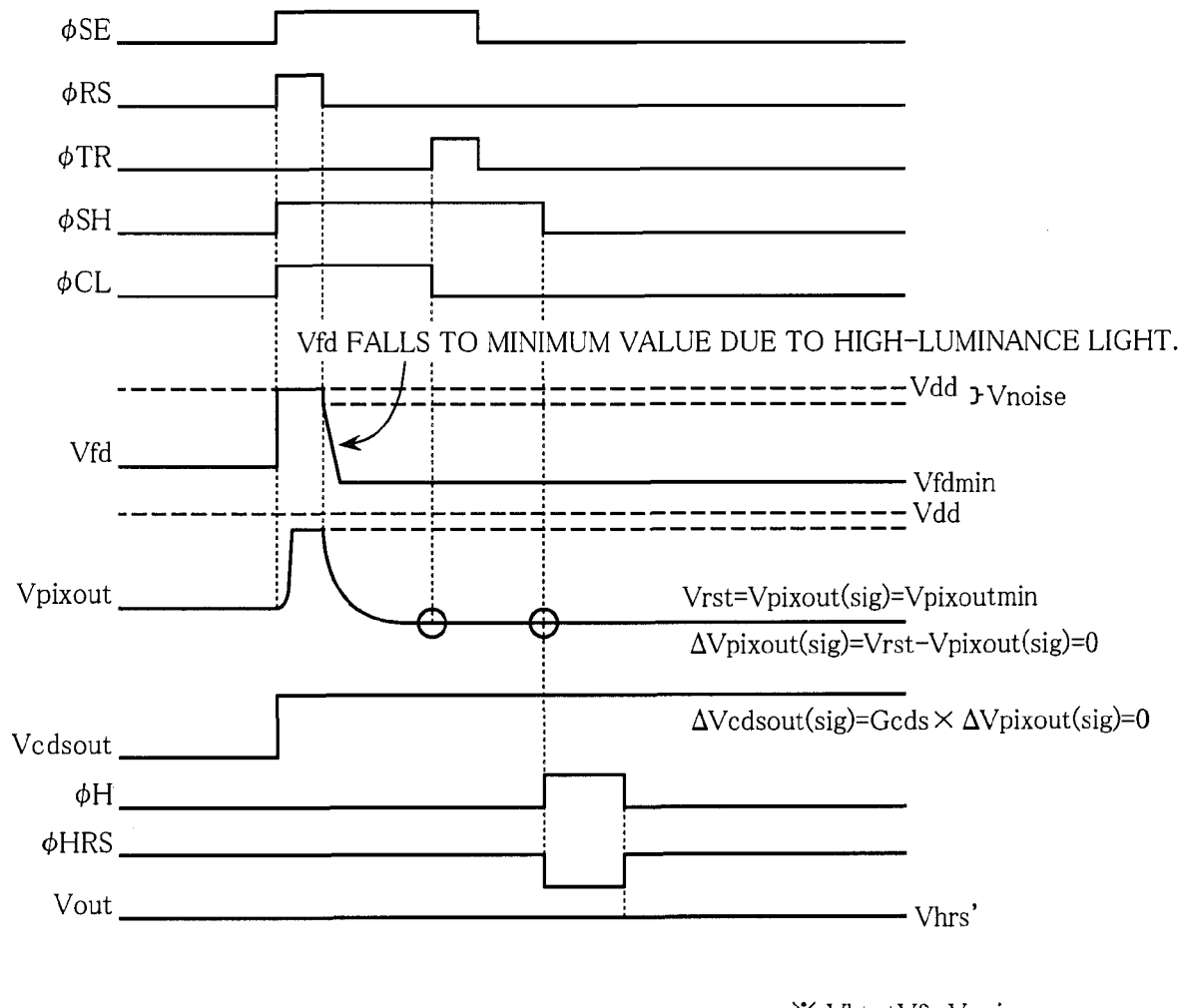
FIG. 3 is a timing chart for explaining operation in the case where a high-luminance light is incident in the CMOS image sensor shown in FIG. 1.
Figure 4:
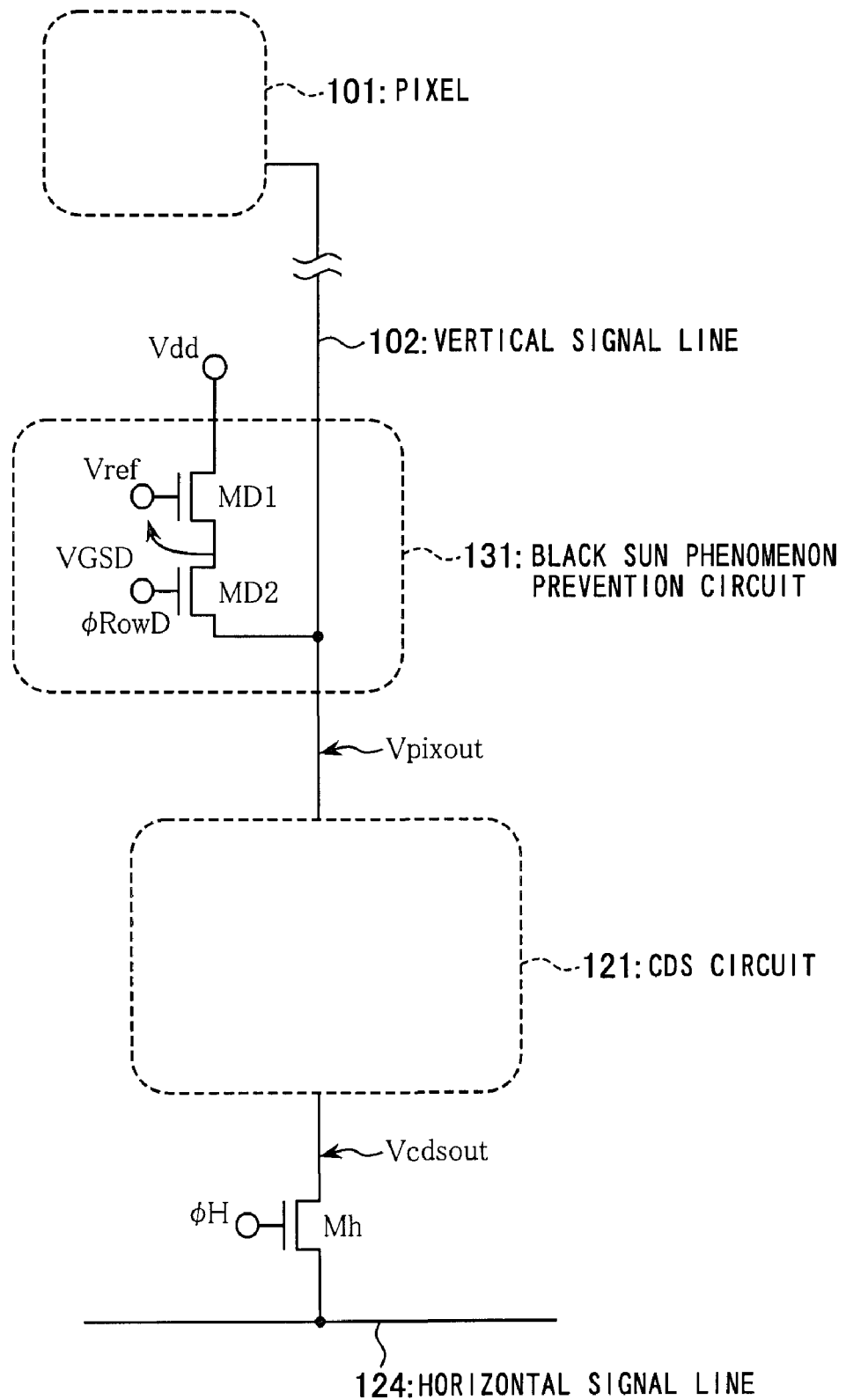
FIG. 4 is a circuit diagram showing construction of a prior-art black sun phenomenon prevention circuit.
Figure 5:
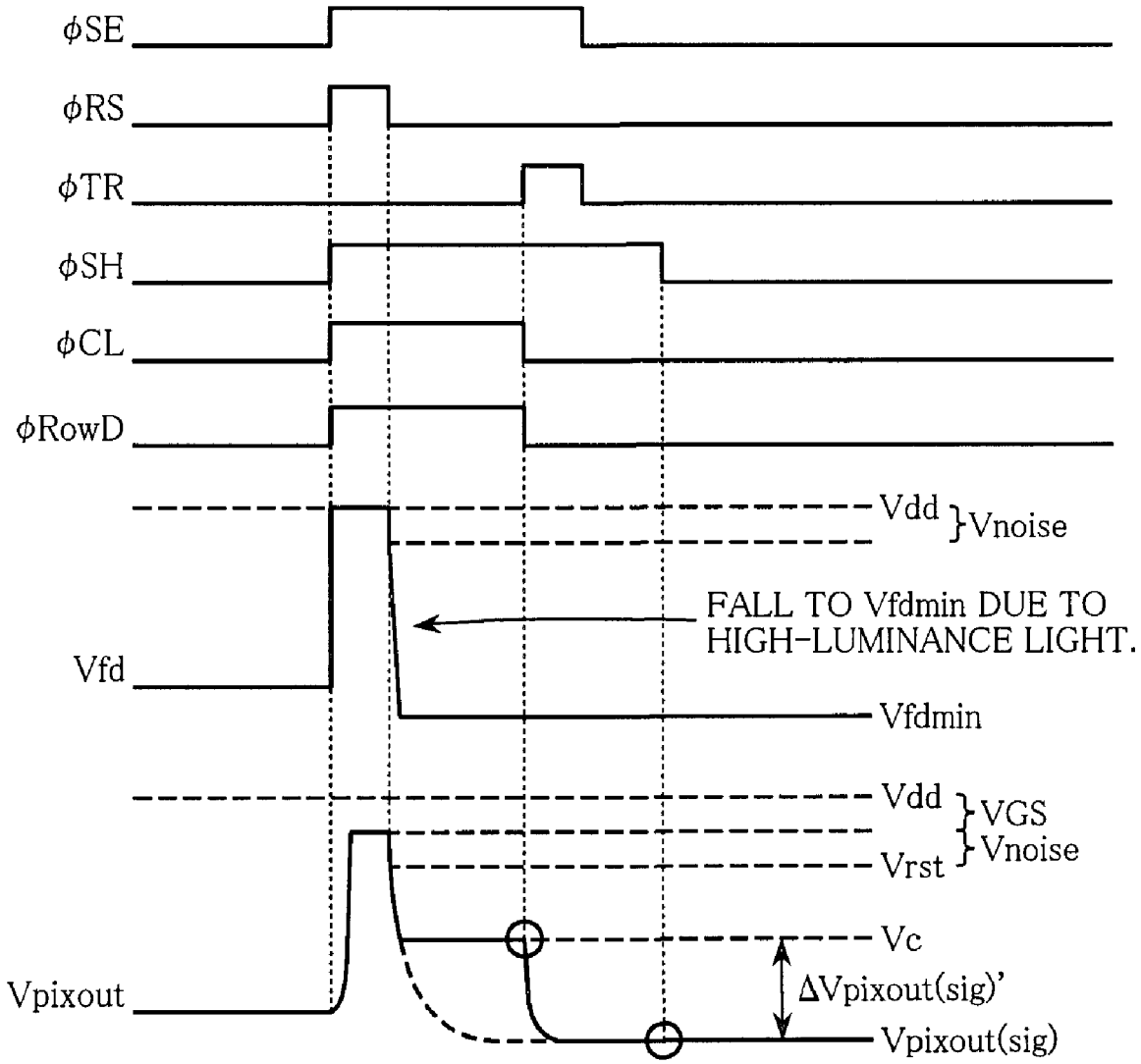
FIG. 5 is a timing chart for explaining operation of the black sun phenomenon prevention circuit shown in FIG. 4.
Figure 6:
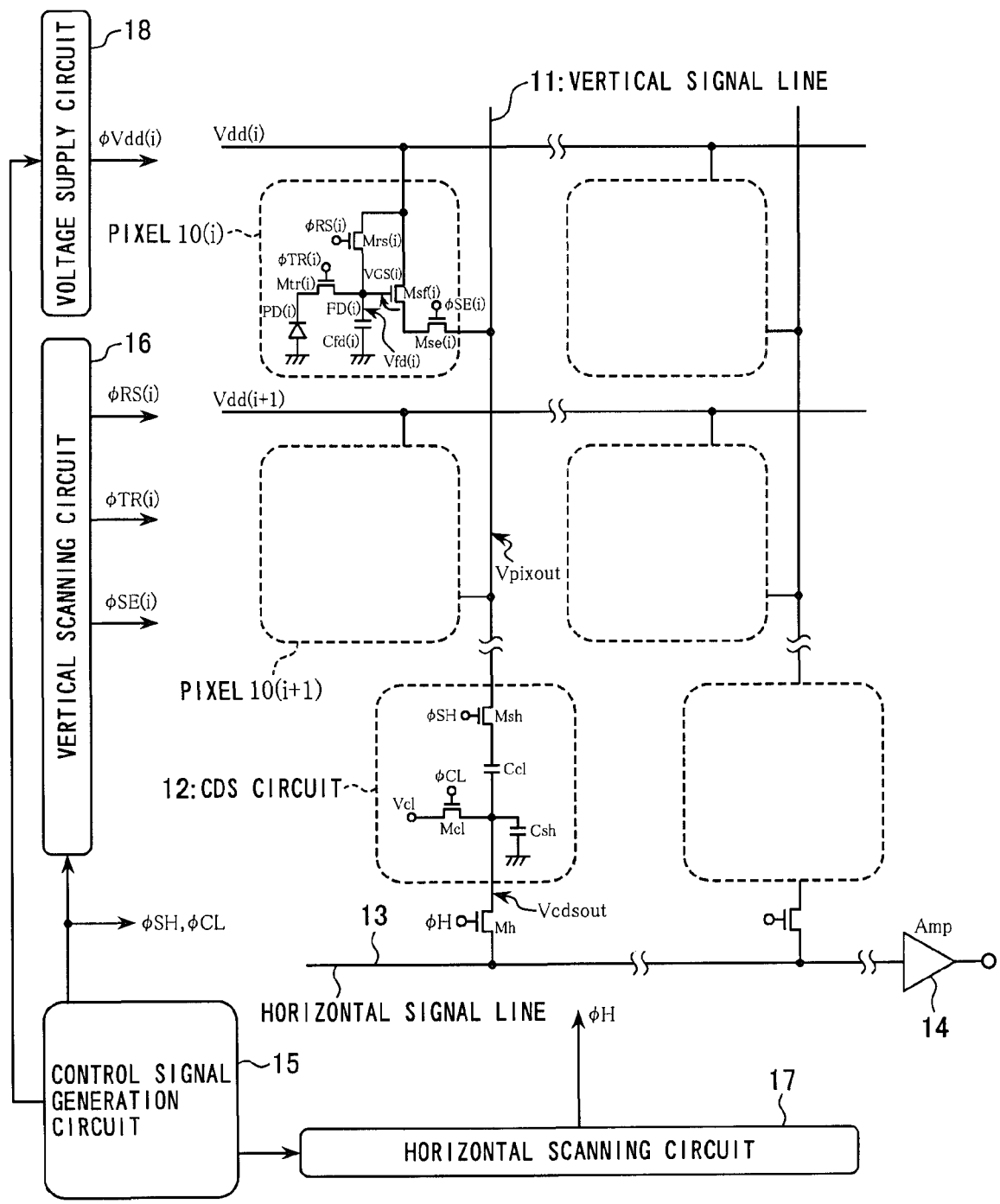
FIG. 6 is a circuit diagram showing partially in blocks a first embodiment of the solid-state imaging apparatus according to the invention.

A first embodiment of the invention will now be described. FIG. 6 is a circuit diagram showing partially in blocks construction of the first embodiment of the solid-state imaging apparatus according to the invention. Referring to FIG. 6, a numeral 10 denotes a pixel section having a plurality of pixels of the same construction that are two-dimensionally arranged. Pixels 10(i), 10(i+1) ("i" being an integral number) are the pixels disposed adjacent to each other in a vertical direction; since these are of the same construction, their internal construction will be described below with respect to the pixel 10(i) as representative. The pixel 10(i) includes: a photodiode PD(i); a floating diffusion section FD(i) having an electrostatic capacitance of Cfd(i); a transfer transistor Mtr(i); a reset transistor Mrs(i); an amplification transistor Msf(i); and a select transistor Mse(i).

The pixel 10(i) then is connected to a constant current supply (not shown) and a CDS circuit 12 through a vertical signal line 11. The CDS circuit 12 includes: a sample-and-hold transistor Msh; a clamp transistor Mcl; a sample-and-hold capacitor (electrostatic capacitance) Csh; and a clamp capacitor (electrostatic capacitance) Ccl. The CDS circuit 12 is connected to a horizontal signal line 13 through a column select transistor Mh. Further, the pixel 10(i) is connected to a power supply line of a power supply voltage Vdd(i) and to the vertical signal line 11, and the vertical signal line 11 is connected through the CDS circuit 12 and column select transistor Mh to the horizontal signal line 13. From the horizontal signal line 13, signals are outputted through an amplifier 14.

The pulse voltages for controlling the components of each of the above described sections are respectively generated at a vertical scanning circuit 16, a horizontal scanning circuit 17, and a voltage supply circuit 18 under control by a control signal generation circuit 15. For example: a reset pulse φRS(i), transfer pulse φTR(i), and a select pulse φSE(i) for effecting control concerning the reset transistor Mrs(i), transfer transistor Mtr(i) and select transistor Mse(i) are generated at the vertical scanning circuit 16; a pulse voltage φH for effecting control concerning the column select transistor Mh is generated at the horizontal scanning circuit 17; a pulse voltage φVdd(i) for effecting control concerning the power supply voltage Vdd(i) is generated at the voltage supply circuit 18; and a sample-and-hold pulse φSH and clamp pulse φCL for effecting control concerning the sample-and-hold transistor Msh and the clamp transistor Mcl are generated by the control signal generation circuit 15.

An adjacent pixel (i+1) also has a similar construction so that it is connected in a similar manner to the power supply line and to the vertical signal line 11 and is connected through the CDS circuit 12 and the column select transistor Mh to the horizontal signal line 13. It is then driven and controlled by control pulses φRS(i+1), φTR(i+1), φSE(i+1) from the vertical scanning circuit 16 and by a pulse voltage φVdd(i+1) from the voltage supply circuit 18.

Figure 7:
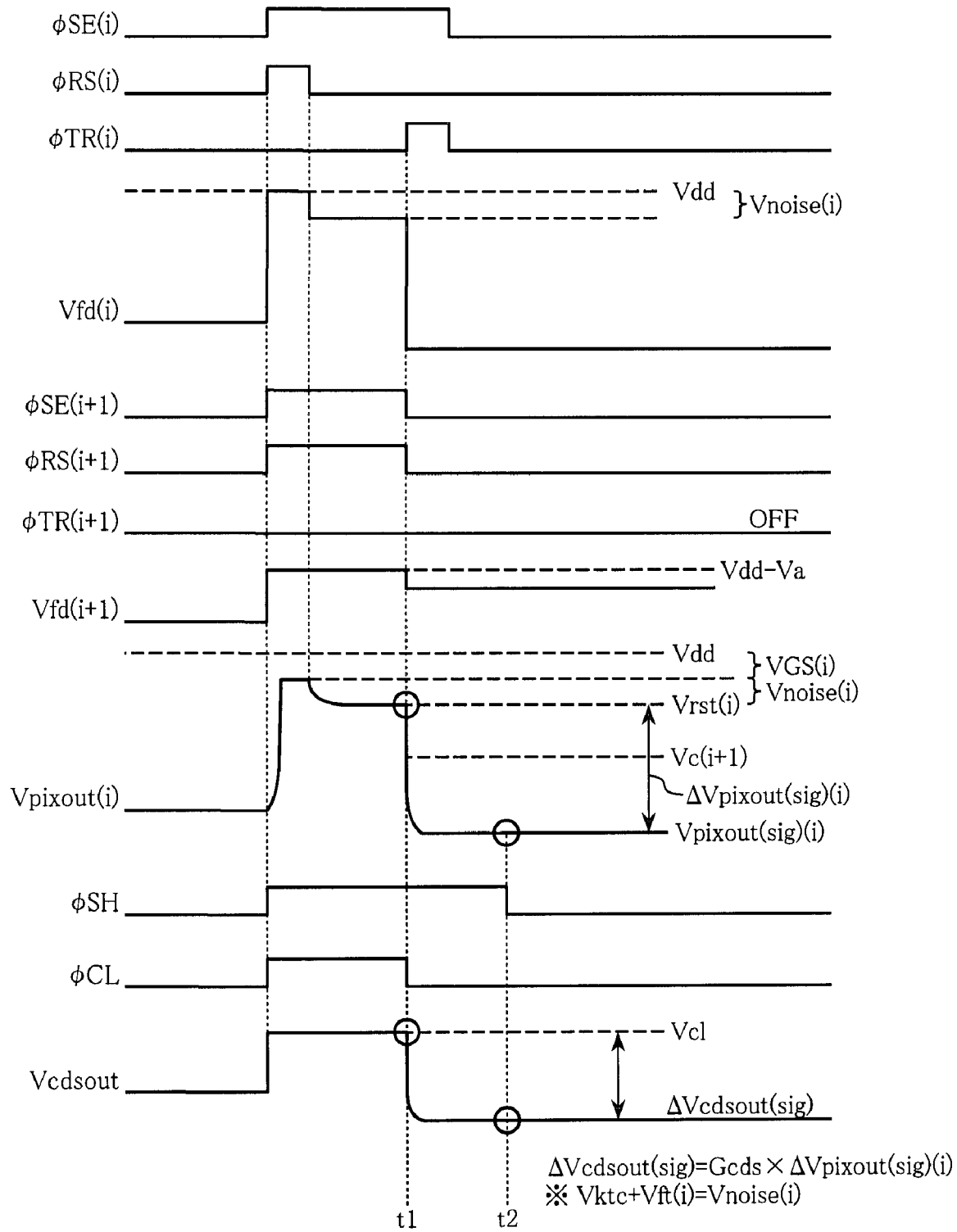
FIG. 7 is a timing chart for explaining operation of the first embodiment shown in FIG. 6.

FIG. 7 is a timing chart for explaining operation of the first embodiment shown in FIG. 6. In the present embodiment, row of correcting pixels (pixel for generating clip voltage) to be used for the prevention of black sun phenomenon is also displaced together with the displacement of row from which light signals are read out. A pixel from which signal of light is read out is at first determined as the pixel 10(i), and a pixel for generating clip voltage to prevent the black sun phenomenon (correcting pixel) is determined as the pixel 10(i+1). The power supply voltage Vdd(i+1) of the row of black sun phenomenon preventing pixels (i+1'th row) is set as Vdd(i)>Vdd(i+1)=Vdd−Va, i.e. lower by Va from the voltage Vdd of the row of pixels to be read (i'th row).

At first, the reset pulse φRS(i) is driven to High level in a condition where the select pulse φSE(i), sample-and-hold pulse φSH, and clamp pulse φCL are at High level. The floating diffusion section potential Vfd(i) is thereby set to the power supply voltage Vdd, and the CDS circuit output voltage Vcdsout is set to a clamp reference voltage Vcl. Also at the same time, the select pulse φSE(i+1) is driven to High level, the reset pulse φRS(i+1) to high level and the transfer pulse φTR(i+1) to Low level so as to set the floating diffusion section voltage Vfd(i+1) to the power supply voltage (Vdd−Va). Since the power supply voltage (Vdd−Va) is the voltage for generating clip voltage, it is set to a voltage lower by Va than the power supply voltage Vdd of the pixel to be read (i).

$(Vdd(i+1)=Vdd-Va).$

Next, when the reset pulse φRS(i) is brought to Low level, the pixel output voltage Vpixout attains a reset voltage Vrst(i)[=Vdd−Vnoise(i)−VGS(i)], i.e. lowered from Vdd due to the effect of ktc noise component Vktc(i) and feed-through voltage component Vft(i) at the reset transistor Mrs(i) (supposing noise due to the reset transistor Mrs(i) as Vnoise(i)=Vktc(i)+Vft(i)), and the effect of the gate-source voltage VGS(i) of the amplification transistor Msf(i). Here, since Va>Vnoise(i) is set so that Vfd(i)>Vfd(i+1) when a high-luminance light is not incident, the output Vpixout(i) of the pixel 10(i) becomes a vertical signal line output Vrst(i).

Next at time t1, the select pulse φSE(i+1), reset pulse φRS(i+1), and clamp pulse φCL are brought to Low level, and the transfer pulse φTR(i) is driven to High level. Signal electric charges of light cumulated at the photodiode PD(i) for a predetermined time are thereby transferred to the floating diffusion section FD(i) so that the floating diffusion section voltage Vfd(i) falls, and the pixel output voltage Vpixout(i) is also lowered correspondingly to the signal electric charges. At this time, therefore, the difference voltage between the pixel light signal voltage Vpixout(sig)(i) and the reset voltage Vrs(i) attains ΔVpixout(sig)(i)=Vrst(i)−Vpixout(sig)(i).

The CDS circuit output voltage Vcdsout is also lowered correspondingly to the signal electric charges. Supposing that Qcl as the amount of electric charges cumulated at the clamp capacitor Ccl at time t1 and Qsh as the amount of electric charges cumulated at the sample-and-hold capacitor Csh, and supposing that Qcl' as the amount of electric charges cumulated at the clamp capacitor Ccl when the sample-and-hold pulse φSH is brought to Low level at time t2 and Qsh' as the amount of electric charges cumulated at the sample-and-hold capacitor Csh, these are expressed as in the following equations (9), (10).

At time t1:

$$Qcl = Ccl(Vrst(i) - Vcl)$$

$$Qsh = Csh(Vcl - 0) \quad (9)$$

At time t2:

$$Qcl' = Ccl[V\text{pixout}(\text{sig})(i) - V\text{cdsout}(\text{sig})]$$

$$Qsh' = Csh(V\text{cdsout}(\text{sig}) - 0) \quad (10)$$

From the conservation law of electric charge at time t1, t2, the following equation (11) is obtained.

$$-Qcl + Qsh = -Qcl' + Qsh' \quad (11)$$

$$Vcl - V\text{cdsout}(\text{sig}) = Ccl/(Ccl + Csh) \cdot \begin{bmatrix} Vrst(i) - \\ V\text{pixout}(\text{sig})(i) \end{bmatrix}$$

$$\Delta V\text{cdsout}(\text{sig})(i) = Gcds \cdot \Delta V\text{pixout}(\text{sig})(i)$$

where:

$$Gcds = Ccl/(Ccl + Csh)$$

Even with the same amount of light, the pixel output voltage Vpixout(i) is outputted also with having a variance due to the variance of (Vnoise(i)+VGS(i)), i.e. the sum of the noise at the reset transistor Mrs(i) and the gate-source voltage of the amplification transistor Msf(i) of each pixel. By taking difference from the reset voltage Vrst(i) at each pixel also containing variance components by means of the CDS circuit 12, however, it is possible as shown in the following equation (12) to remove the variance of [Vnoise(i)+VGS(i)], i.e. the sum of the noise at the reset transistor Mrs(i) and the gate-source voltage of the amplification transistor Msf(i).

$$Vrst(i) - V\text{pixout}(\text{sig})(i) = [Vdd - \{V\text{noise}(i) + VGS(i)\}] - \quad (12)$$

$$\left[ Vdd - \left\{ \begin{array}{c} V\text{noise}(i) + VGS(i) + \\ \Delta V\text{pixout}(\text{sig})(i) \end{array} \right\} \right]$$

$$= \Delta V\text{pixout}(\text{sig})(i)$$

Figure 8:
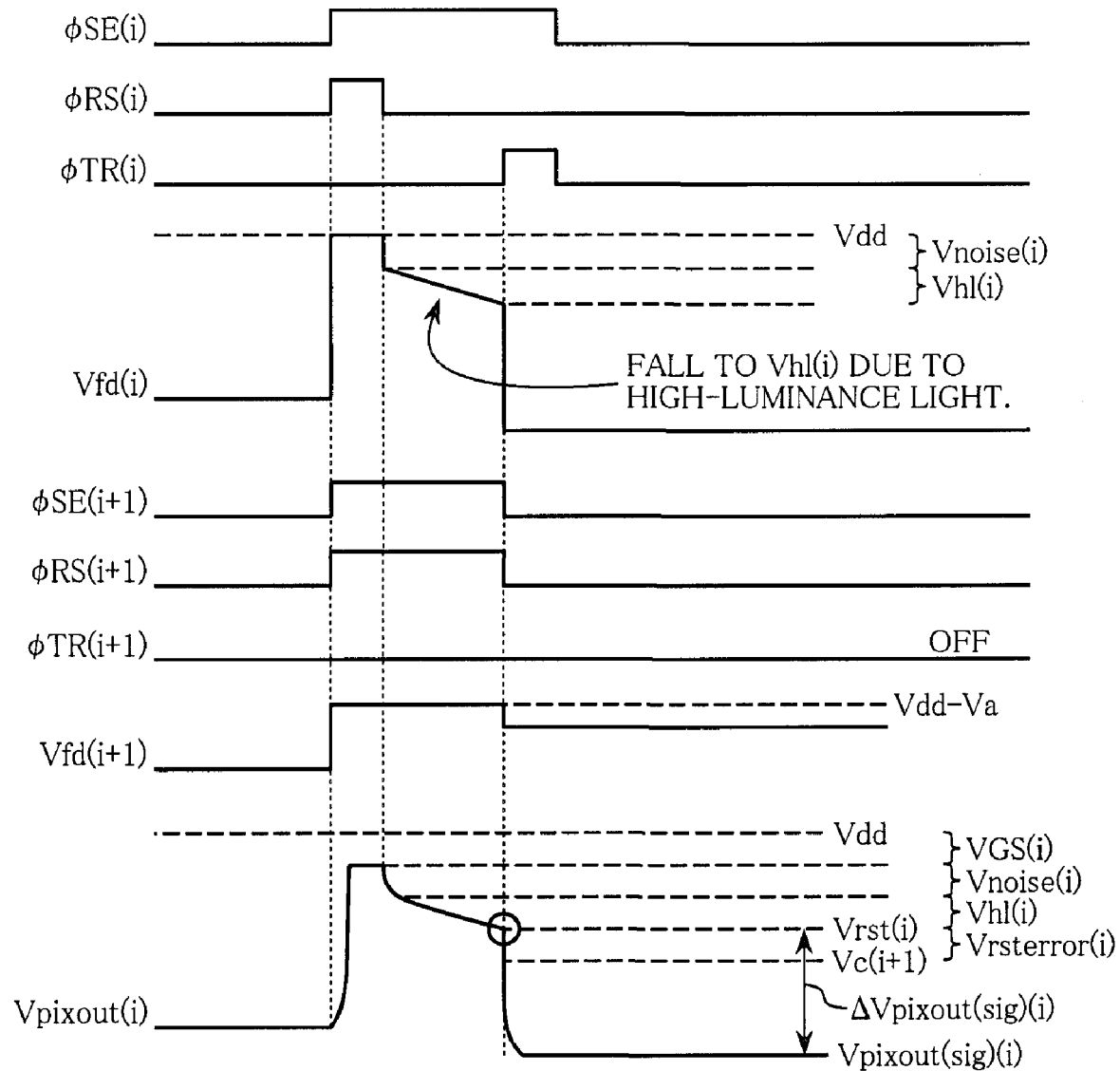
FIG. 8 is a timing chart for explaining operation at the time of incidence of a high-luminance light in the first embodiment shown in FIG. 6.

A description will be given below by way of a timing chart shown in FIG. 8 with respect to operation of each section when a high-luminance light is incident so that a fall of voltage Vhl(i) due to the high-luminance light occurs. A detail of operation except Vfd(i) and Vpixout(i) is similar to the timing chart shown in FIG. 7 and will be partially omitted. The floating diffusion section voltage Vfd(i) of the pixel (i) shown in FIG. 8 falls by voltage Vhl due to the high-luminance light during the sampling and holding of the reset voltage, and as a result the pixel output voltage Vpixout(i) is also lowered. Since the select pulse φSE(i+1) and the reset pulse φRS(i+1) of the pixel 10(i+1) are kept at High level, the floating diffusion section voltage Vfd(i+1) is set at the power supply voltage (Vdd−Va). Here, since Vfd(i)<Vfd(i+1) if Vnoise(i)+Vhl>Va, the pixel output voltage Vpixout(i) does not fall beyond the clip voltage Vc(i+1)[=Vdd−Va−VGS(i+1)] so that the reset voltage is clipped at the clip voltage Vc(i+1).

At the time of incidence of high-luminance light, therefore, the black sun phenomenon does not occur even when the pixel output voltage Vpixout(i) is lowered by the voltage Vhl(i) due to the high-luminance light. When the pixel light signal voltage is Vpixout(sig)(i), if the black sun phenomenon preventing pixel is actuated, a signal voltage of [Vc(i+1)−Vpixout(sig)(i)] is obtained by the CDS circuit 12. In the case where it is assumed that the black sun phenomenon does not occur, on the other hand, a signal voltage of [Vrst−Vpixout(sig)(i)] is obtained by the CDS circuit 12. At this time, supposing Vrsterror(i) as the difference between the reset voltage Vrst(i) and the clip voltage Vc(i+1) in the pixel output voltage Vpixout(i), it is represented as in the following equation (13).

$$Vrsterror(i) = Vrst(i) - Vc(i+1) \quad (13)$$

$$= -VGS(i) + VGS(i+1) - Vhl(i) + Va$$

where noise Vnoise(i) of the reset transistor Mrs(i) is small and is regarded as ignorable, and Va is regarded as a constant. From this, the conditions of the following (14) are derived.

Vrsterror(i)>0: Not to actuate operation for generating the black sun phenomenon prevention clip voltage.

Vrsterror(i)<0: To actuate operation for generating the black sun phenomenon prevention clip voltage. (14)

Here, the pixels 10(i) and 10(i+1) are an adjacent pixel to each other so that VGS(i)≈VGS(i+1) is presumed. The equation (13) can be expressed therefore as in the following equation (15).

$$Vrsterror(i) = -Vhl + Va \quad (15)$$

It can be seen from the equation (15) therefore that, in the first embodiment of the invention, whether or not an operation for generating the black sun phenomenon prevention clip voltage is effected does not depends on the gate-source voltage VGS of the amplification transistor Msf of each pixel.

Figure 9:
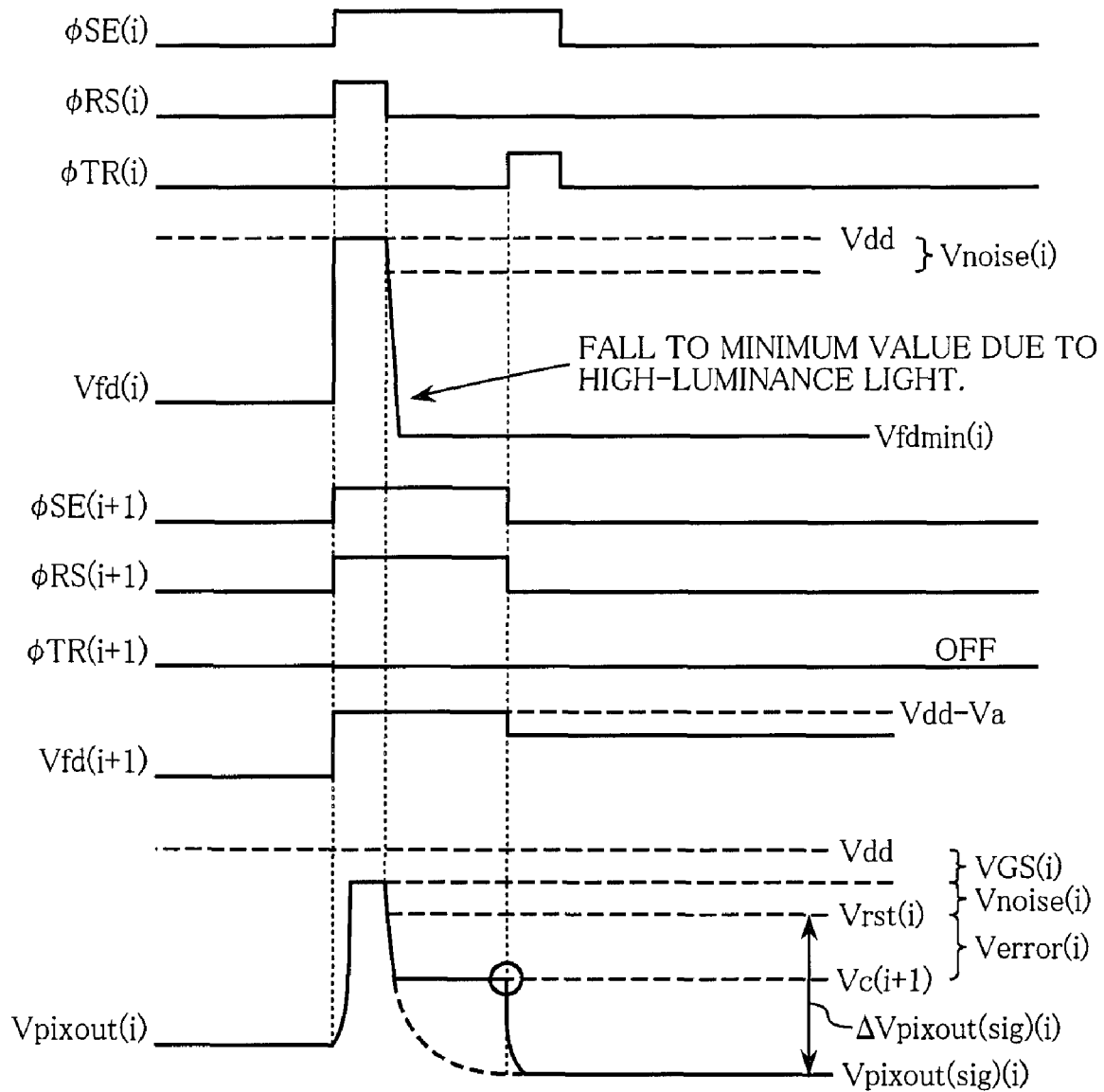
FIG. 9 is a timing chart for explaining operation in the case where a high-luminance light is incident in the first embodiment shown in FIG. 6 so that pixel for generating clip voltage to prevent the black sun phenomenon is actuated.

A case will now be considered where a more intense high-luminance light is incident to result in Vrsterror(i)<0 so that the black sun phenomenon prevention clip voltage generating pixel is actuated. FIG. 9 shows a timing chart for explaining operation of each section at this time. A detail of operation except the floating diffusion section voltage Vfd(i) and the pixel section output voltage Vpixout(i) is similar to the timing chart shown in FIG. 7 and will partially be omitted. As shown in FIG. 9, the floating diffusion section voltage Vfd(i) falls to a floating diffusion section minimum voltage Vfdmin(i) due to the effect of the high-luminance light. As a result, the pixel output voltage Vpixout(i) is also lowered. At this time, because of the operation of the select pulse φSE(i+1), reset pulse φRS(i+1), and transfer pulse φTR(i+1) of the pixel 10(i+1), the floating diffusion section voltage Vfd(i+1) of the pixel 10(i+1) is set at the power supply voltage (Vdd−Va). Thus, the pixel output voltage Vpixout(i) does not fall beyond the clip voltage Vc(i+1) and is clipped at the clip voltage Vc(i+1).

At the time of incidence of high-luminance light, therefore, the black sun phenomenon does not occur even when the pixel output voltage Vpixout(i) is lowered by the voltage Vhl(i) due to the high-luminance light, and, when the pixel section light signal voltage is Vpixout(sig)(i), a signal voltage of [Vc(i+1)−Vpixout(sig)(i)] or a signal voltage of [Vrst(i)−Vpixout(sig)(i)] is obtained by means of the CDS circuit 12. Supposing at this time ΔVpixout(i) as the actual signal voltage when the black sun phenomenon prevention clip voltage generating pixel is not actuated, and ΔVpixout'(i) as the signal voltage when the black sun phenomenon prevention clip voltage generating pixel is actuated, these are expressed as in the following equations (16), (17).

$$\Delta Vpixout(i) = Vrst(i) - Vpixout(sig)(i) \quad (16)$$
$$= Vdd - \{VGS(i) + Vnoise(i)\} -$$
$$\left[Vdd - \left\{\begin{matrix} VGS(i) + Vnoise(i) + \\ \Delta Vpixout(sig)(i) \end{matrix}\right\}\right]$$
$$= \Delta Vpixout(sig)(i)$$

$$\Delta Vpixout(i)' = Vc(i+1) - Vpixout(sig)(i) \quad (17)$$
$$= (Vdd - Va) - VGS(i+1) -$$
$$\left[Vdd - \left\{\begin{matrix} VGS(i) + Vnoise(i) + \\ \Delta Vpixout(sig)(i) \end{matrix}\right\}\right]$$

The difference between these is obtained as in the following equation (18).

$$Verror(i) = \Delta Vpixout(i) - \Delta Vpixout(i)' \quad (18)$$
$$= Va + VGS(i+1) - \{VGS(i) + Vnoise(i)\}$$

Accordingly, an error of Verror(i) in (18) is caused to occur on the theoretical light signal even after put through the CDS circuit 12.

Here, the pixels 10(*i*) and 10(*i*+1) are an adjacent pixel to each other so that VGS(i)≈VGS(i+1) is presumed. In addition, supposing the noise Vnoise(i) of the reset transistor Mrs(i) is small and ignorable, and Va as a constant, the equation (18) can be expressed therefore as in the following equation (19).

$$Verror(i) = Va \quad (19)$$

It can be seen from (19) that, in the first embodiment, the signal voltage obtained when the operation of the black sun phenomenon prevention clip voltage generating pixel is actuated is changed correspondingly to Va from the actual signal voltage, and that the gate-source voltage VGS(i) component of the amplification transistor Msf(i) can be eliminated by the CDS circuit 12. An image without occurrence of the black sun phenomenon can be obtained by extracting the signals of each pixel with sequentially effecting similar operation on the pixels arranged in the array.

From the above, according to the first embodiment as described, the black sun phenomenon can be prevented even when a high-luminance light is incident on the pixel section of the solid-state imaging apparatus, and whether or not the operation of the black sun phenomenon prevention clip voltage generating pixel is actuated does not depends on the gate-source voltage VGS(i) of the amplification transistor Msf(i) of pixel. Further, it is possible to make smaller the FPN variance when the black sun phenomenon prevention clip voltage generating pixel is actuated. Furthermore, it is not necessary to separately provide a circuit for the prevention of the black sun phenomenon. It should be noted that, while a description has been given with respect to the one where the pixel 10(*i*+1) adjacent to the pixel 10(*i*) for reading light signal is used as the near pixel for generating the black sun phenomenon prevention clip voltage, any of those pixels disposed into the array can be used as required as the black sun phenomenon prevention clip voltage generating pixel.

Embodiment 2

Figure 10:
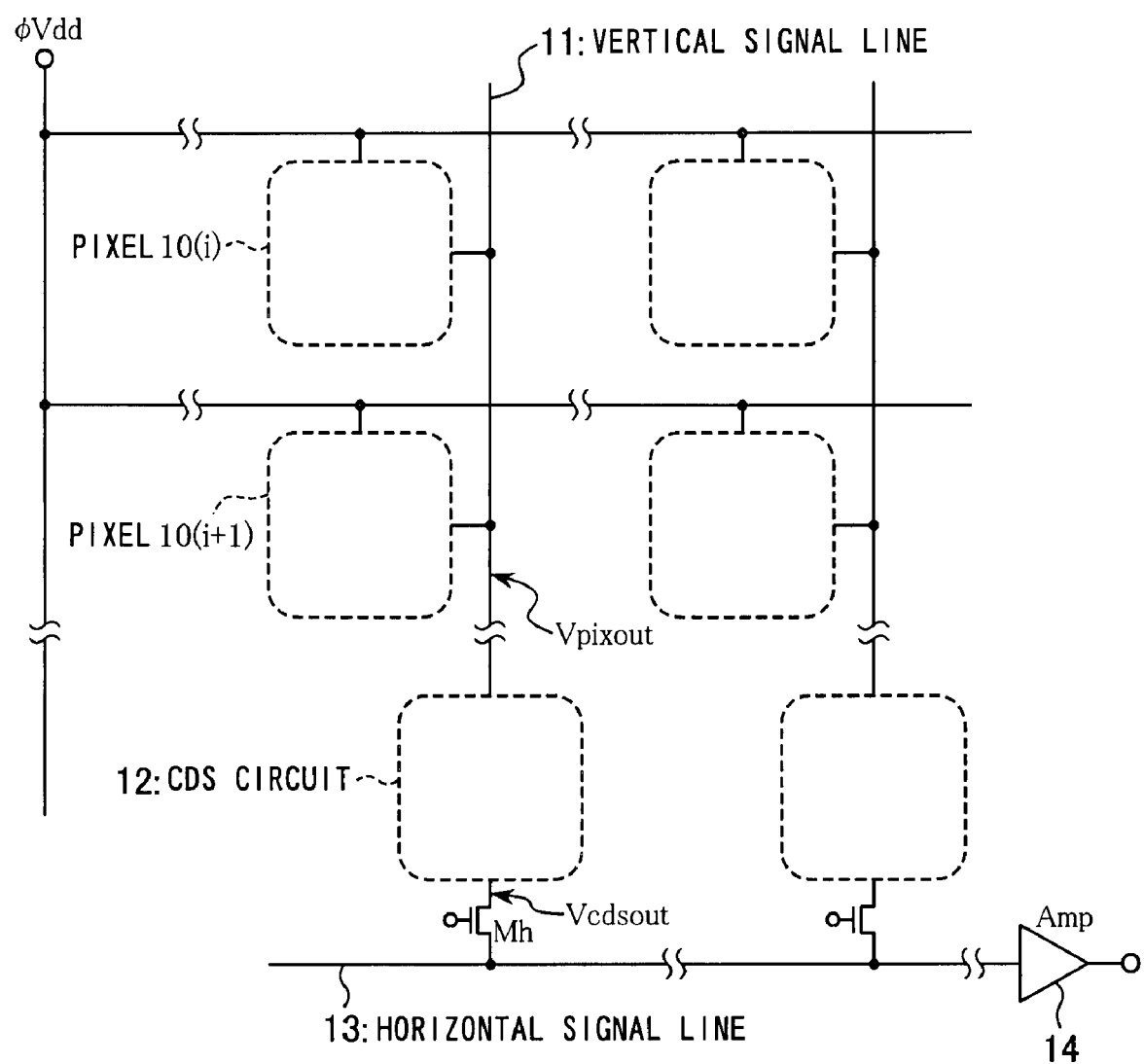
FIG. 10 is a partially omitted block diagram showing the solid-state imaging apparatus according to a second embodiment.

A second embodiment of the invention will now be described. FIG. 10 is a partially omitted block diagram of the solid-state imaging apparatus according to the second embodiment. The internal construction, etc. of the pixels 10(*i*), 10(*i*+1), . . . as disposed into an array and of the CDS circuit 12 is similar to the first embodiment shown in FIG. 6. It is different from the first embodiment in that, while the power supply line in the first embodiment is provided separately line by line from the power supply circuit 18, all power supply lines of the pixels 10(*i*), 10(*i*+1), . . . as disposed into the array in the second embodiment are connected to the same one power supply line. Further, the power supply voltage is not constant and it is adapted so as to be changed in a manner of pulse to a reset reference voltage Vddr and to a clip reference voltage Vddc as power supply pulse φVdd.

Figure 11:
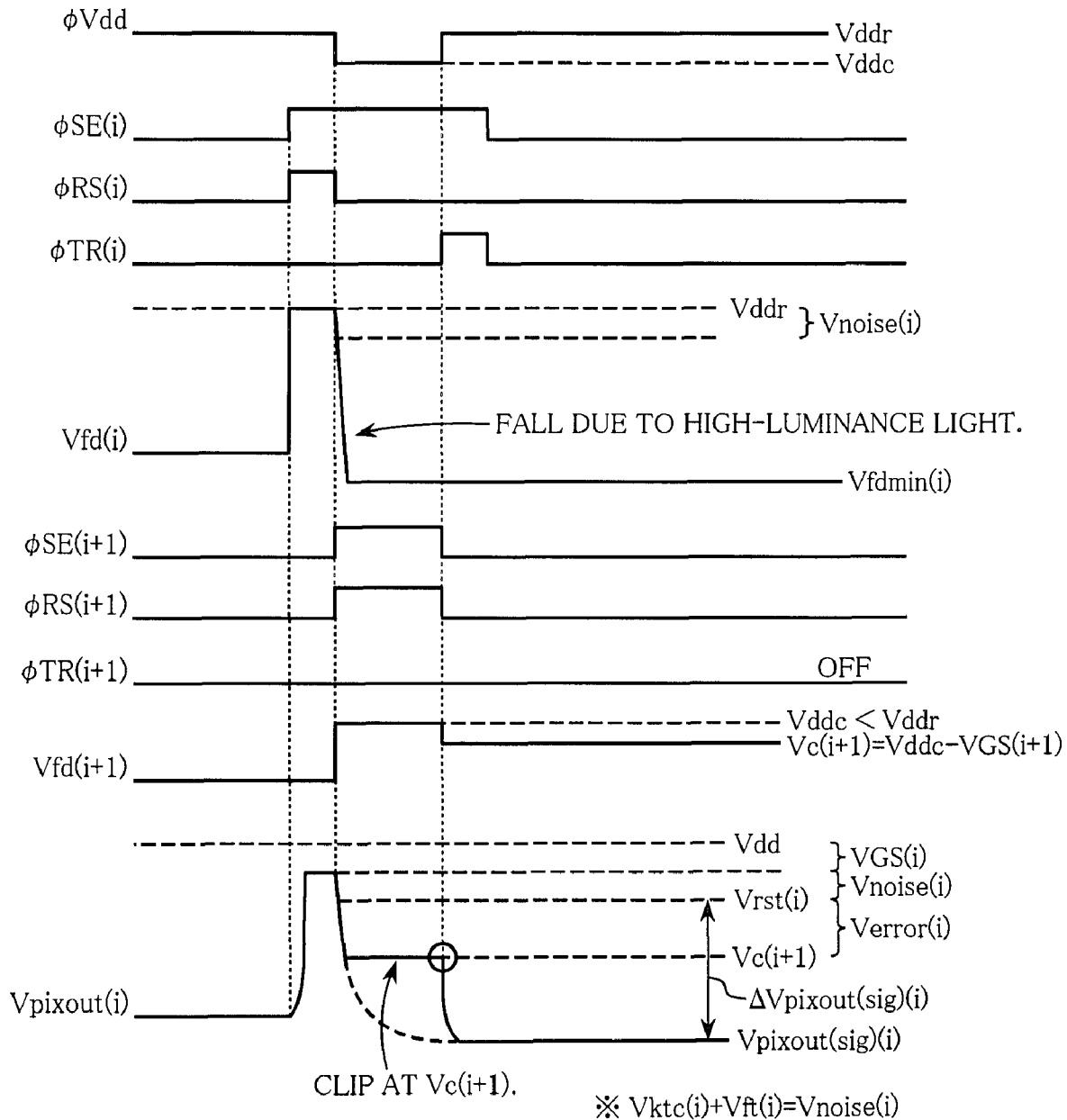
FIG. 11 is a timing chart for explaining operation of the second embodiment shown in FIG. 10.

A timing chart for explaining operation of the second embodiment is shown in FIG. 11. A detailed explanation of operation of the CDS circuit 12 will be omitted, and its operation is assumed to be similar to the first embodiment. Also in this case the pixel 10(*i*) is supposed as the pixel from which signal of light is read out, and the pixel 10(*i*+1) as the pixel for generating a clip voltage to prevent the black sun phenomenon. At first, in the condition where the power supply pulse φVdd is at the reset reference voltage Vddr, the select pulse φSE(i) is driven to High level and the reset pulse φRS(i) to High level. The floating diffusion section voltage Vfd(i) is thereby set to the voltage of the reset reference voltage Vddr.

Next, when the reset pulse φRS(i) is brought to Low level, the pixel output voltage Vpixout(i) attains a reset voltage Vrst(i)[=Vddr−Vnoise(i)−VGS(i)] as lowered from the reset reference voltage Vddr due to the effect of ktc noise component Vktc(i) and the feed-through voltage Vft(i) of the reset transistor Mrs(i) (supposing the noise of the reset transistor Mrs(i) as Vnoise(i)=Vktc(i)+Vft(i)) and the gate-source voltage VGS(i) of the amplification transistor Msf(i).

Next, in the condition where the power supply pulse φVdd is at the clip reference potential Vddc, the select pulse φSE (i+1) is driven to High level, reset pulse φRS(i+1) to High level, and transfer pulse φTR(i+1) to Low level, to set the floating diffusion section voltage Vfd(i+1) to the clip reference voltage Vddc. The clip reference voltage Vddc is set to a voltage lower by Va than the reset reference voltage Vddr for the purpose of generating clip voltage. (Vddc=Vddr−Va).

Next, the floating diffusion section voltage Vfd(i) falls to a minimum value Vfdmin(i) allowable by the floating diffusion section due to the effect of the high-luminance light while the reset voltage is sampled and held, and, as a result, the pixel output voltage Vpixout(i) is also lowered. At the pixel 10(*i*+1), on the other hand, because of the above described conditions of the select pulse φSE(i+1), the reset pulse φRS(i+1), and the transfer pulse TR(i+1), the floating diffusion section voltage Vfd(i+1) is previously set at the clip reference voltage Vddc. At the pixel 10(*i*), therefore, its pixel output voltage Vpixout(i) does not fall beyond the clip voltage Vc(i+1) [=Vddc−VGS(i+1)] so that the reset voltage is clipped at the clip voltage Vc(i+1).

Next, the select pulse φSE(i+1) is brought to Low level and the transfer pulse φTR(i) to High level to transfer a signal voltage by light to the pixel output voltage Vpixout(i). An image without occurrence of the black sun phenomenon can be obtained by extracting the signals of each pixel with sequentially effecting similar operation on the pixels arranged in the array.

From the above, the black sun phenomenon does not occur even when the pixel output voltage Vpixout(i) is lowered at the time of incidence of the high-luminance light, and when the pixel light signal voltage is supposed as Vpixout(sig)(i), a signal voltage of [Vc(i+1)−Vpixout(sig)(i)] is obtained by the CDS circuit 12. Therefore, similar advantages as the first embodiment are obtained also in the second embodiment. It should be noted that, while a description has been given with respect to the one where the pixel 10(i+1) adjacent to the pixel 10(i) for reading light signal is used as the near pixel or the pixel for generating the black sun phenomenon prevention clip voltage, any of those pixels disposed into the array can be used as required as the black sun phenomenon prevention clip voltage generating pixel.

Embodiment 3

Figure 12:
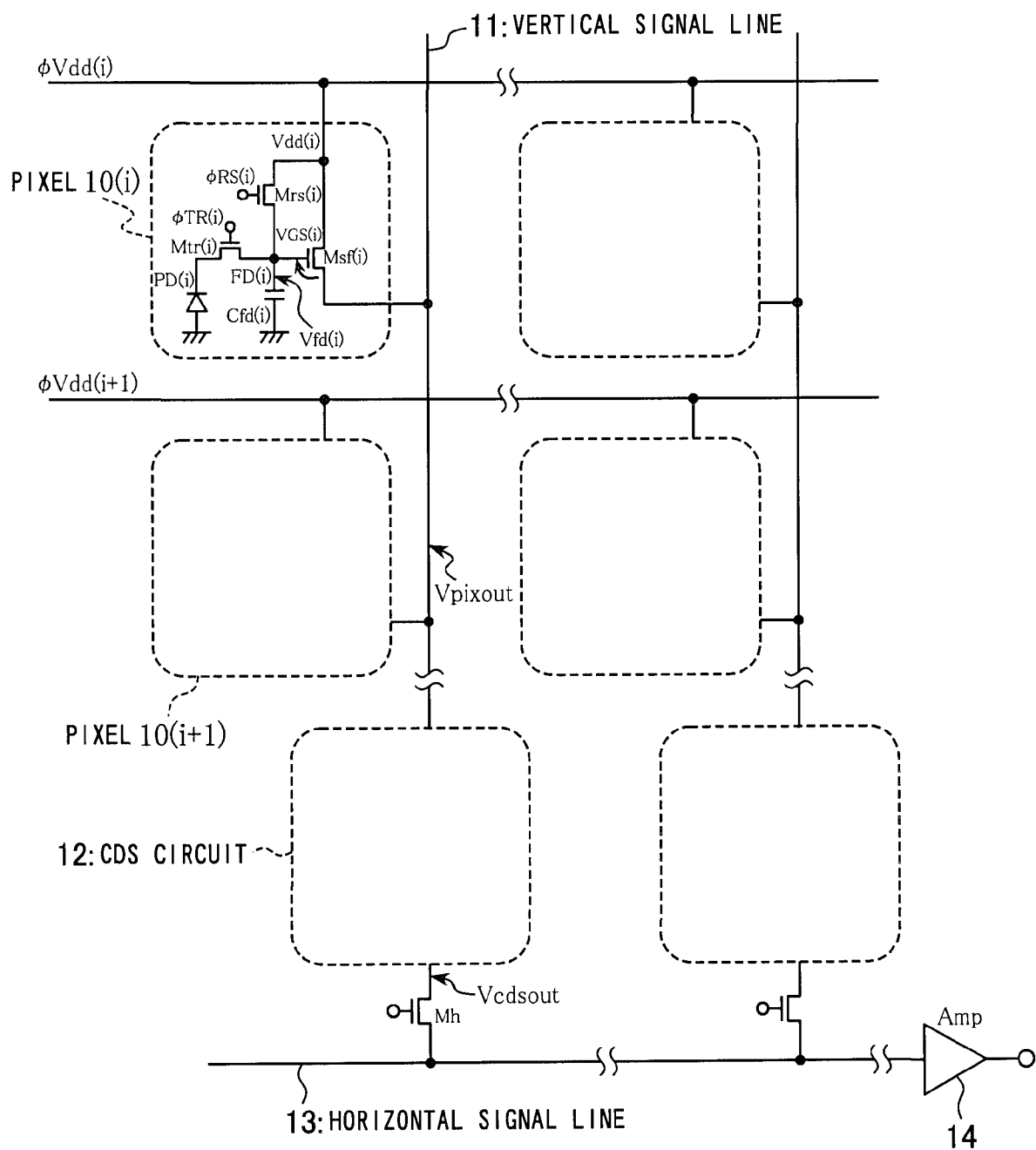
FIG. 12 is a partially omitted block diagram showing the solid-state imaging apparatus according to a third embodiment.

A third embodiment of the invention will now be described. FIG. 12 is a partially omitted circuit diagram of the solid-state imaging apparatus according to the third embodiment. The construction of this embodiment is identical to the first embodiment with the exception of absence of select transistors Mse(i), Mse(i+1), . . . in the arrayed pixels, i.e. different only in that 3-transistor type pixels are used as the pixels. The voltages of the power supply pulses φVdd(i), φVdd(i+1), φVdd(k) can be changed independently from each other (where "i" is an integral number and "k" is an integral number but "i", "i+1").

Figure 13:
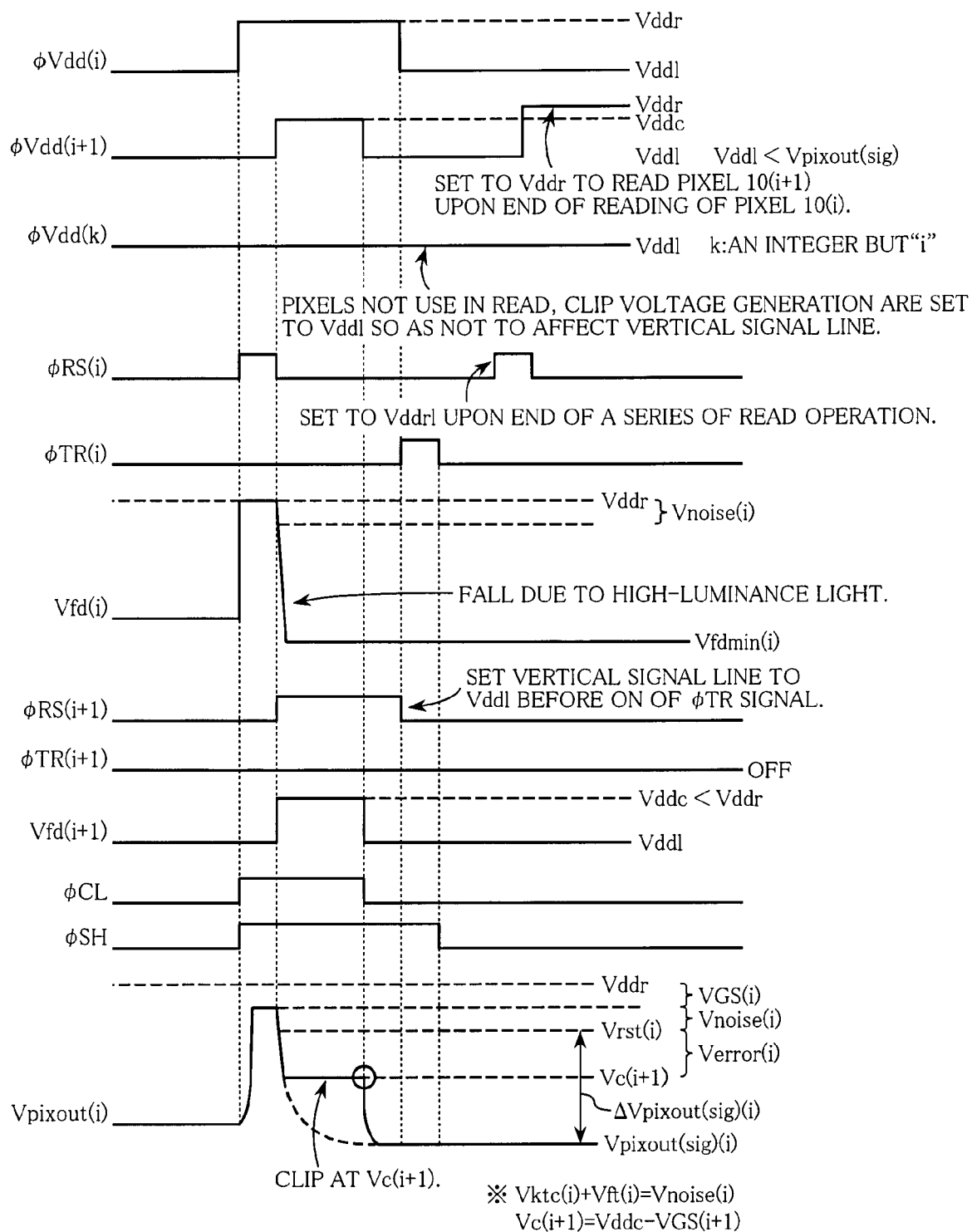
FIG. 13 is a timing chart for explaining operation of the third embodiment shown in FIG. 12.

FIG. 13 shows a timing chart for explaining operation of the third embodiment. Also in this embodiment, the pixel 10(i) is supposed as a pixel for reading signal of light and the pixel 10(i+1) as a pixel for generating clip voltage to prevent the black sun phenomenon. Initially, the power supply pulse φVdd(i) is set to the reset reference pulse φVddr to drive the reset pulse φRS(i) to High level. The floating diffusion section voltage Vfd(i) is thereby set to the reset reference voltage Vddr. Further, the clamp pulse φCL and the sample-and-hold pulse φSH are previously driven to High level to clamp a reset voltage at the CDS circuit 12.

Next, the power supply pulse φVdd(k) is previously set to a non-select pixel voltage Vddl of the value which is lower than a minimum value Vpixoutmin of light signal occurring on the vertical signal line 11, so as to set the floating diffusion section voltage Vfd(k) of non-select pixel to the non-select pixel voltage Vddl. Next, when the reset voltage φRS(i) is brought to Low level, the pixel output voltage Vpixout(i) attains a reset voltage Vrst(i) [=Vddr−Vnoise(i)−VGS(i)], i.e. lowered from the reset reference voltage Vddr as affected by ktc noise component Vktc(i) and feed-through voltage Vft(i) at the reset transistor Mrs(i) (where noise at the reset transistor Mrs(i) is supposed as Vnoise(i)=Vktc(i)+Vfi(i)), and the gate-source voltage VGS(i) of the amplification transistor Msf(i).

Next, the power supply pulse φVdd(i+1) is set to a clip reference voltage Vddc (<Vddr), and the reset pulse φRS(i+1) is driven to High level and the transfer pulse φTR(i+1) to Low level to set the floating diffusion section voltage Vfd(i+1) to the clip reference voltage Vddc. Since the clip reference voltage Vddc is the voltage for generating clip voltage, it is set to a voltage lower by Va than the reset reference voltage Vddr. (Vddc=Vddr−Va).

Next, the floating diffusion section voltage Vfd(i) falls to a minimum voltage Vfdmin(i) allowable by the floating diffusion section due to the effect of the high-luminance light while the reset voltage is sampled and held, and, as a result, the pixel output voltage Vpixout(i) also falls. At the pixel 10(i+1), on the other hand, because of the conditions of the reset pulse φRS(i+1) at High level, the transfer pulse φTR(i+1) at Low level, and Vdd(i+1)=Vddc, the floating diffusion section voltage Vfd(i+1) is previously set to the clip reference voltage Vddc. For this reason, the pixel output voltage Vpixout(i) at the pixel 10(i) does not fall beyond the clip voltage Vc(i+1)[=Vddc−VGS(i+1)] so that the reset voltage is clipped to the clip voltage Vc(i+1).

Next, it is necessary to lower the voltage of the vertical signal line 11 to the non-select pixel voltage Vddl so as to transfer the signal electric charges of light. The power supply pulse φVdd(i+1) of the pixel 10(i+1), therefore, is set to the non-select reference voltage Vddl, and the clamp pulse φCL is brought to Low level while the reset pulse φRS(i+1) is kept at High level. Next, the transfer pulse φTR(i) of the pixel 10(i) is driven to High level to transfer signal voltage by light to the pixel output voltage Vpixout(i). Further, both the power supply pulse φVdd(k) and the power supply pulse φVdd(i+1) at this time are previously set at the non-select pixel voltage Vddl so that only the voltage of the floating diffusion section Vfd(i) of the pixel 10(i) occurs on the pixel output voltage Vpixout(i).

Next, when the next row is to be read out, the power supply pulse φVdd(i+1) of the pixel 10(i+1) is set to the reset reference voltage Vddr; and, after that, similar operation is repeated to sequentially read signals of light. An image with the black sun phenomenon suppressed can be obtained by extracting the signals of each pixel with sequentially effecting similar operation on the pixels arranged in the array.

From the above operation, the black sun phenomenon does not occur even when the pixel output voltage Vpixout(i) is lowered at the time of incidence of the high-luminance light, and when the pixel light signal voltage is supposed as Vpixout(sig)(i), a signal voltage of [Vc(i+1)−Vpixout(sig)(i)] is obtained by the CDS circuit 12. Therefore, similar advantages as the first embodiment are obtained also in the third embodiment. It should be noted that, while a description has been given with respect to the one where the pixel 10(i+1) adjacent to the pixel 10(i) for reading light signal is used as the near pixel for generating clip voltage to prevent the black sun phenomenon, any of those pixels disposed into the array can be used as required as the clip voltage generating pixel for preventing the black sun phenomenon.

According to the solid-state imaging apparatus of the present invention as has been described, the black sun phenomenon can be prevented even when a high-luminance light is incident on the pixel section, and whether or not the black sun phenomenon preventing operation is actuated does not depend on the gate-source voltage of the amplification transistor of pixel. Further, it is possible to make smaller the FPN variance in the state where the black sun phenomenon preventing operation is actuated. Furthermore, it is not necessary to provide a separate circuit to prevent the black sun phenomenon.

The advantages of each aspect of the invention are as follows. According to the first aspect, the voltage level of the same one signal output line when resetting a first pixel is set with using a pixel signal corresponding to a second potential supplied by the reset section of a second pixel. It is thereby possible to provide a solid-state imaging apparatus where the black sun phenomenon that occurs when noise signal is suppressed with a correlation double sampling circuit can be suppressed without providing a separate black sun phenomenon preventing circuit. Further, the fact that a pixel located in the vicinity of the first pixel is used as the second pixel makes it possible to mitigate the dependence on threshold voltage of pixel in generating a clip voltage to prevent the black sun phenomenon. According to the second aspect, the black sun phenomenon can be suppressed, since an output is fixed at a level set by the level of the second potential in the case where the output level onto the signal output line when resetting the first pixel is lower than the level set by the second potential. According to the third aspect, the second pixel is sequentially changed in accordance with the location of the first pixel so that the black sun phenomenon can be effectively suppressed. According to the fourth aspect, it is possible to set on the signal output line a potential suitable for suppressing the black sun phenomenon, since the potential of the reset line is made changeable by the unit of row so that the potential of each reset line connected to the respective pixels is variably set in accordance with a setting of the first pixel and the second pixel. According to the fifth aspect, since the end timing of application of the second potential on the second pixel is delayed from the end timing of application of the first potential on the first pixel, it is possible to make suitable the timing at which the potential for suppressing the black sun phenomenon is set on the signal output line. According to the sixth aspect, a construction associated with the reset line can be simplified, since it is made possible to variably supply a single potential to the reset lines so that the potential of the reset line is controlled so as not to cause an overlap of timings at which different potentials are respectively applied to the first pixel and to the second pixel. According to the seventh aspect, before driving the transfer section of the first pixel, by setting on the same one signal output line a voltage level for outputting pixel signal corresponding to the signal electric charges of the first pixel with using a pixel signal corresponding to a third potential supplied by the reset section of the second pixel, it is possible so as not to output pixel signal from the second pixel onto the signal output line without providing within the pixel a select section for selecting pixel from which pixel signal is outputted onto the signal output line. It is thereby possible to make larger the photoelectric conversion section.

What is claimed is:

1. A solid-state imaging apparatus comprising:
    a pixel section having a plurality of pixels two-dimensionally arranged into a matrix, each pixel containing a photoelectric conversion section for converting an incident light into signal electric charges, an accumulation section for accumulating said signal electric charges, a transfer section for transferring said signal electric charges to said accumulation section, an amplification section for amplifying said signal electric charges accumulated at said accumulation section and outputting it onto a signal output line as a pixel signal, and a reset section for resetting the accumulation section by supplying a potential retained at a reset line to said accumulation section;
    a correlation double sampling circuit connected to one end of said signal output line for suppressing a noise signal associated with reset operation by said reset section, contained in said pixel signal outputted onto said signal output line; and
    a control section where, of a first one of said pixels and a second one of said pixels connected to the same one of said signal output line, when said first pixel is determined as a pixel subject to reset operation for obtaining an output of said pixel signal corresponding to a first potential supplied by said reset section, a voltage level of said same one signal output line at the time of said reset operation is set with using a pixel signal corresponding to a second potential supplied by said reset section of said second pixel;
    wherein said second pixel is a pixel located in the vicinity of said first pixel.

2. The solid-state imaging apparatus according to claim 1, wherein said control section sets said second potential to a level lower than said first potential.

3. The solid-state imaging apparatus according to claim 1, wherein said control section sequentially changes said second pixel in accordance with location of said first pixel.

4. The solid-state imaging apparatus according to claim 1, wherein the potential of said reset line is changeable by the unit of row, and said control section variably sets the potential of each reset line connected to the respective pixels in accordance with a setting of said first pixel and said second pixel.

5. The solid-state imaging apparatus according to claim 1, wherein said control section causes an end timing of application of said second potential to said second pixel to be delayed from an end timing of application of said first potential to said first pixel.

6. The solid-state imaging apparatus according to claim 1, wherein said reset line is capable of variably supplying a single potential to all pixels, and said control section controls potentials of said reset line so as not to cause an overlap of timings of applying different potentials respectively to said first pixel and to said second pixel.

7. The solid-state imaging apparatus according to claim 1, wherein said control section, before driving the transfer section of said first pixel, uses a pixel signal corresponding to a third potential supplied by said reset section of said second pixel to set to said same one signal output line a voltage level for outputting a pixel signal corresponding to signal electric charges of said first pixel.

* * * * *